United States Patent [19]
Dierks et al.

[11] Patent Number: 5,608,227
[45] Date of Patent: Mar. 4, 1997

[54] MERCURY-VAPOR HIGH-PRESSURE SHORT-ARC DISCHARGE LAMP, AND METHOD AND APPARATUS FOR EXPOSURE OF SEMICONDUCTOR WAFERS TO RADIATION EMITTED FROM SAID LAMP

[75] Inventors: Joern Dierks; Juergen Maier, both of Berlin, Germany

[73] Assignee: Patent-Treuhand-Gesellschaft F. Elektrische Gluehlampen mbH, Munich, Germany

[21] Appl. No.: 517,594

[22] Filed: Aug. 22, 1995

[30] Foreign Application Priority Data

Sep. 12, 1994 [DE] Germany .............. 44 32 315.8

[51] Int. Cl.$^6$ .............. H01J 61/86; H01J 61/20; H01J 61/40; C03C 17/34
[52] U.S. Cl. .............. 250/492.1; 250/504 R; 313/571
[58] Field of Search .............. 250/492.1, 504 R, 250/493.1; 313/571

[56] References Cited

U.S. PATENT DOCUMENTS

| | | | |
|---|---|---|---|
| 3,684,908 | 8/1972 | Beese | 313/24 |
| 3,842,304 | 10/1974 | Beyer et al. | 313/44 |
| 4,689,519 | 8/1987 | Ooms et al. | 313/112 |
| 4,732,842 | 3/1988 | Kira . | |
| 4,841,342 | 6/1989 | Suzuki et al. | 355/71 |
| 5,017,839 | 5/1991 | Arlt et al. | 315/219 |
| 5,109,181 | 4/1992 | Fischer et al. | 313/571 |
| 5,220,235 | 6/1993 | Wakimizu et al. | 313/25 |

FOREIGN PATENT DOCUMENTS 3744386  8/1989  Germany .

OTHER PUBLICATIONS

"Zeitschr.f.techn.Physik" (Journal of Technological Physics), vol. 11, pp. 377–379, article by Rompe and Thouret, Light Density of Mercury Discharge, etc. (1936).

Primary Examiner—Jack I. Berman
Attorney, Agent, or Firm—Frishauf, Holtz, Goodman, Langer & Chick, P.C.

[57] ABSTRACT

To essentially eliminate short ultraviolet (UV) radiation from a mercury high-pressure short-arc discharge lamp, that is, wavelengths below the radiation band of 365 nm, the lamp includes a discharge vessel of quartz glass which is coated with a selectively reflective outer coating (2a) and, at the inside, with a selectively absorbing inner coating (2b). The outer coating (2a) is formed by a multi-layer interference reflection filter which preferentially reflects wavelengths between about 240 and 300 nm with a filter cut-off, corresponding to 50% transmission, in the wavelength region between about 290 and 330 nm. The inner coating (2b) is a titanium dioxide coating which, preferentially, absorbs radiation below about 250 nm, with a 50% transmission at about 240 nm. In accordance with a preferred feature of the invention, a radiation absorbing titanium dioxide/silicon dioxide mixed-layer coating (2c) is applied at the outside over the multi-layer interference reflection filter (2a). The outer absorbing coating preferentially absorbs radiation below about 280 nm. Preferably, the multi-layer interference reflection filter is formed by at least 8 alternating $ZrO_2$ and $SiO_2$ individual layers; all the coating layers preferably have thicknesses between about 30 and 50 nm.

22 Claims, 7 Drawing Sheets

MERCURY-VAPOR HIGH-PRESSURE SHORT-ARC DISCHARGE LAMP, AND METHOD AND APPARATUS FOR EXPOSURE OF SEMICONDUCTOR WAFERS TO RADIATION EMITTED FROM SAID LAMP

Reference to related patent and application, the disclosures of which are hereby incorporated by reference:
U.S. Pat. No. 4,732,842, Kira;
U.S. Ser. No. 08/410,724, filed Mar. 27, 1995, Dierks and Maier.
Reference to related literature:
"Zeitschr.f.techn.Physik" ("Journal of Technological Physics"), vol. 11, pages 377–379, article by Rompe and Thouret, "Light Density of Mercury Discharge etc.", (1936).
German Patent DE 37 44 368 C1, Arfsten et al., published Aug. 3, 1989.

FIELD OF THE INVENTION

The present invention relates to a short-arc mercury-vapor high-pressure discharge lamp particularly suitable for exposure of semiconductor wafers, and to a system and method for exposing semiconductor wafers to radiation emitted from such a lamp.

BACKGROUND

Short-arc mercury-vapor high-pressure discharge lamps have been known since about the middle of the 1930's as light sources for projection use. They are characterized by high brightness. They also have high ultraviolet radiation intensity, see the referenced "Zeitschr.f.techn.Physik" ("Journal of Technological Physics"), vol. 11, pages 377–379, article by Rompe and Thouret, "Brightness of Mercury Discharge etc.", (1936). Today, such lamps have a discharge vessel made of quartz glass in which two electrodes, spaced from each other, are sealed. The discharge vessel includes a fill including xenon and mercury. The electrodes and fill are so arranged that, in operation of the lamp, the mercury of the fill provides spectral lines of radiation, including an intense line having a wavelength of about 365 nm. The radiation output, also, includes further radiation from lines below 365 nm wavelength. Such lamps have been used for many years in micro-lithography for the exposure of photo lacquers and photo resists used, for example, in the manufacture of integrated circuits, for irradiating wafers or chips. Further development of optical micro-lithography has recently accelerated and substantial interest resides in increasing the storage density or circuit density of the integrated circuits on a wafer. Additionally, the economics of the manufacturing processes are being improved.

The requirement of increasingly higher circuit and storage densities in modern integrated circuits requires manufacture of smaller and smaller structures. Consequently, as the resolution of the structure depends largely on the wavelength of the radiation used to expose semiconductor wafers, and coatings, such as photo resists, thereon the radiation of the intense mercury line of about 365 nm is being used in modern exposure equipment as suitable imaging apparatus, especially adapted to this wavelength became commercially available recently.

Details of an exposure system, when using radiation having a wavelength of 365 nm from a mercury-vapor lamp, are described in the referenced U.S. Pat. No. 4,732,842, Kira, the disclosure of which is hereby incorporated by reference. The economics of exposure to make integrated circuits is improved by decreasing the exposure time and increasing the power of the lamps used for exposure. Nominal powers in the kilowatt range have become feasible.

Powerful short-arc mercury-vapor high-pressure discharge lamps radiate not only at the desired radiation wavelength of 365 nm but, additionally, emit substantial radiation in shorter ultraviolet (UV) wavelength ranges. Expensive filtering in the radiation path, for example introduced into the illuminating systems, leads to problems. It is not possible to completely filter undesired radiation and, further, filtering also attenuates the radiation of the desired wavelength of 365 nm. Filtering was done for example by UV blocking filters, such as interference filters and color filters.

Radiation below about 330 nm can be absorbed in glass of the optical system, but, if so, causes heating of the optical system. This heat must be removed by suitable cooling systems in order to avoid unacceptable heating of the overall system. Radiation below about 330 nm, further, leads to radiation damage of the optical cements used in the imaging optics, even after only comparatively short time of use. Radiation below about 300 nm leads to radiation damage in the glasses themselves, by solarization.

Radiation below about 280 nm wavelength leads to mutual interaction with the surrounding atmosphere and vapor-like contaminants, for example derived from chemicals and organic solvents used in the manufacture of integrated circuits. This interaction leads to formation of aggressive and reactive ozone and condensable compounds and cracked products, all of which can deposit or precipitate on the surfaces of the optical components and form undesirable coatings.

It is desirable to reduce the technical requirements for UV blocking filters, cooling, and air-conditioning and air-cleaning systems. Furthermore, the expensive downtime required by service and repair on the extremely expensive exposure apparatus should be reduced. Typically, such exposure apparatus is used 24 hours per day. Consequently, the light sources in exposure systems should provide a high output in the desired wavelength of 365 nm, but preferably none, or if so, highly attenuated, interfering shorter wavelength UV radiation.

THE INVENTION

It is an object to provide a mercury-vapor short-arc lamp suitable, for example, for the exposure of semiconductor wafers, in which the generated radiation is emitted practically unattenuated at the desired wavelength of the mercury vapor line of 365 nm by the discharge vessel, while suppressing or attenuating undesired shorter wavelength UV radiation. These radiation wavelengths, of less than 365 nm, emitted from the light source and directed to an optical system, for example a wafer exposure system, should be suppressed.

Briefly, the glass of the discharge vessel itself comprises means for preventing, and essentially inhibiting, emission of radiation from the lamp which has a wavelength shorter than the 365 nm mercury spectral line, while permitting passage of radiation at the 365 nm resonance line of mercury without essential attenuation. The radiation prevention means are devoid of vanadium, or doping of the quartz glass by vanadium.

It is very difficult to solve the problem and meet the object of the invention because the desired wavelength of 365 nm and interfering shorter wave UV radiation regions are spectrally separated by only a few tens (10) nm. Optical means, thus, must have an extremely steep or sharp cut-off of transmission below 365 nm towards shorter wavelength, while placing extremely high requirements on the optical quality of the discharge vessel itself. In modern exposure apparatus, uniformity of light available at the exposed substance, for example the wafer, is also a requirement.

Experiments have been made to meet this object, and it has been tried to incorporate oxides of vanadium, possibly in combination with titanium and tin, in the lamp, see the referenced application U.S. Ser. No. 08/410,724, filed Mar. 27, 1995, by the inventors hereof. After extensive experiments, and in use, it has been found that the drop-off of transmission below the desired wavelength of 365 nm towards shorter wavelengths is not sufficiently steep or sharp and that, even after experimenting with the intensity of doping, some radiation between 300 and 330 nm wavelength still left the discharge vessel. Upon suppression of wavelengths between 300 and 330 nm, some attenuation of the desired radiation at 365 nm also resulted. In use, it has also been found that the optical as well as the manufacturing characteristics of quartz glass which is doped at the same time with the oxides of vanadium, titanium and tin, are not as good as they should be for economical production.

Quartz-glass discharge vessels which are doped with the oxides of vanadium, and selectively also with titanium and tin oxides, have a tendency to show bubbles, apparently due to not entirely homogeneous distribution of the doping substances added to the starting material. At times, strip-like streaks or striations occur, which interfered with the required precision of uniformity and distribution of radiation, that is, for extremes in uniformity of exposure of the plane of wafers required when making integrated circuits. The rate of rejects, thus, was considerable.

Discharge vessels are made in a rotary lathe-like apparatus, in which a tubular blank is exposed to an oxy-hydrogen flame. A starting quartz-glass tube, already doped, is shaped manually by means of a form roller to generate the discharge vessel. When using doped quartz-glass tubing, the time to make such a vessel is about twice as long as the manufacture of the vessel when the quartz-glass tubing is not doped, and requires higher energy input. The reason for the longer manufacturing time is that the infrared (IR) emission of quartz glass doped with metal oxides is higher than that of undoped quartz glass. A doped quartz-glass tube which is heated to about 2,000° C. in an oxy-hydrogen flame, which is the temperature necessary for deformation of the tube to form the vessel, cools substantially faster and consequently, leaves the temperature region in which a deformation of the quartz glass can be made faster than a comparable undoped quartz-glass tube. As a consequence, manufacture of a discharge vessel doped with metal oxides from a quartz-glass tube requires about twice the number of heating and reheating steps before the vessel is made than a comparable undoped quartz-glass tube.

Suppressing interfering shortwave UV radiation by absorption within the wall of a discharge vessel by introducing suitable doping substances therein resulted in difficulties with higher power lamps; for example, a lamp of for instance a power rating of 1,500 W will absorb radiation in an amount leading to an increase in wall temperature of the discharge vessel by about 150°–200° C. An increase in discharge vessel temperature by about 150°–200°, which may occur in doped quartz glass, reduces the mechanical stability of the discharge vessel and should be avoided. In order to keep the temperature increase of the discharge vessel to a reasonable level, the discharge vessel had to be redesigned by increasing its size and hence heat capacity, which increased the price and required redesign of the exposure equipment to accept the redesigned lamp.

In accordance with a preferred feature of the invention, the discharge vessel is made of undoped quartz glass tubing and covered at its outside with a selectively radiation reflecting filter.

In accordance with another feature of the invention, the inside of the vessel has in addition a selectively radiation absorbing coating, for example titanium dioxide. Preferably, both the inside and the outside have the respective filter, or radiation absorbing coatings, so that both the outside as well as the inside have a selectively radiation absorbing titanium dioxide coating. The outside of the lamp may have only the selectively radiation reflecting filter, or it can be supplied with a selectively radiation absorbing titanium dioxide/ silicon dioxide mixed coating over the filter.

In accordance with a particularly preferred embodiment of the invention, the outside of the discharge vessel includes a multi-layer interference reflection filter, and the inside a radiation absorbing titanium dioxide coating.

Another, also highly preferred embodiment uses a multi-layer interference reflection filter at the outside and, in addition thereto, an absorbing titanium dioxide/silicon dioxide mixed coating thereover, the last one of which forming a highly refracting layer, integrated into the multi-layer interference reflection filter. The inside of the discharge vessel, preferably, again is coasted with a selectively radiation absorbing titanium dioxide coating.

Doping the quartz glass of the vessel with titanium dioxide can be substituted for the internal selective radiation absorbing titanium dioxide coating. Doping the quartz glass additionally with tin oxide can be substituted for the outer titanium dioxide/silicon dioxide coating.

The multi-layer interference reflection filter reflects primarily radiation in the wavelength region between 240–300 nm and has an absorption edge (corresponding to 50% transmission) at a wavelength of between 290 and 330 nm. It is made of between 8 and 16, preferably 10 layers of about 30 nm to 50 nm thickness in the well known $\lambda/4$ layer construction, alternating $ZrO_2$ and $SiO_2$. Below 240 nm, absorption of radiation due to the $ZrO_2$ also occurs. The $ZrO_2$ layer has a refractive index of about 1.98; the $SiO_2$ layer has a refractive index of about 1.45.

The layers can be made in accordance with any well known dipping or immersion coating method. One such method was developed by the German company Schott Slaswerke (now Opto Chem), applied to the outside of the discharge vessel of the completed but as yet unbased lamp. The coefficient of expansion of the $SiO_2$ layer can be matched to the coefficient of expansion of the $ZrO_2$ layer by doping with an alkaline metal so that, even under the high operating temperatures of up to 900° C., the outside of the discharge vessel will not become cloudy; nor will there be any flaking off or peeling of the coating.

An immersion coating method to make optical single-layer or multi-layer interference layers of metal oxides is described in German Patent 37 44 368 C1, Arfsten et al., published Aug. 3, 1989.

Radiation below 240 nm (50% transmission) is primarily absorbed by an absorbing titanium dioxide coating at the inside of the discharge vessel. A last, highly refractive titanium dioxide/silicon dioxide mixed coating additionally absorbs radiation transmitted of about 280 nm (50% transmission) still passed by the multi-layer interference reflection filter.

The technology to provide titanium dioxide coatings at the inside of discharge vessels has been well known for a long time when making ozone-free xenon short-arc lamps for motion-picture projection with suppression of short-wave ozone generating UV radiation.

The titanium dioxide coating, likewise, is applied in a dipping or immersion process. To generate a titanium dioxide coating, the inside of an undoped quartz-glass tube receives a coating by dipping or immersion into a suspension of titanium dioxide. Excess coating at the outside, and at the ends as well, is removed, and the quartz glass is then deformed to provide the discharge vessel, which is essentially barrel-shaped, and, at the same time, to generate at the inside a titanium dioxide coating which is transparent in the visible and long-wave UV region. This coating is optically perfect.

To make a titanium dioxide/silicon dioxide mixed coating at the outside of the discharge vessel, a dipping process or immersion process of the completely made, but yet unbased lamp, is used within the framework of making the multi-layer interference reflection filter. The thickness of the layers are comparable to the thickness of the zirconium oxide—silicon dioxide layers.

The use of such a filter results in substantial absorption of radiation below 330 nm; the multi-layer interference reflection filter, in combination with a titanium dioxide/silicon dioxide mixed layer, results in a steep drop-off of transmission in wavelength regions between 280 and 300 nm without attenuating the radiation of the desired wavelength of 365 nm. To obtain high radiation intensity in the desired wavelength range, the lamp fill, preferably, has 0.5 to 15 mg/cm$^3$ mercury and xenon with a cold fill pressure between 0.1 and 2 bar, preferably below 2 bar. The electrode spacing of such lamps, operated with d-c, is preferably between about 2 and 9 mm. Power ratings preferably are between 1 and 5 kW. Generally, preferably at least 8 single layers of a multi-layer interference reflection filter at the outside are used, alternately made of $ZrO_2$ and $SiO_2$. The thickness of the individual layers is preferably between about 30 nm to 50 nm.

DRAWINGS

Figure 4:
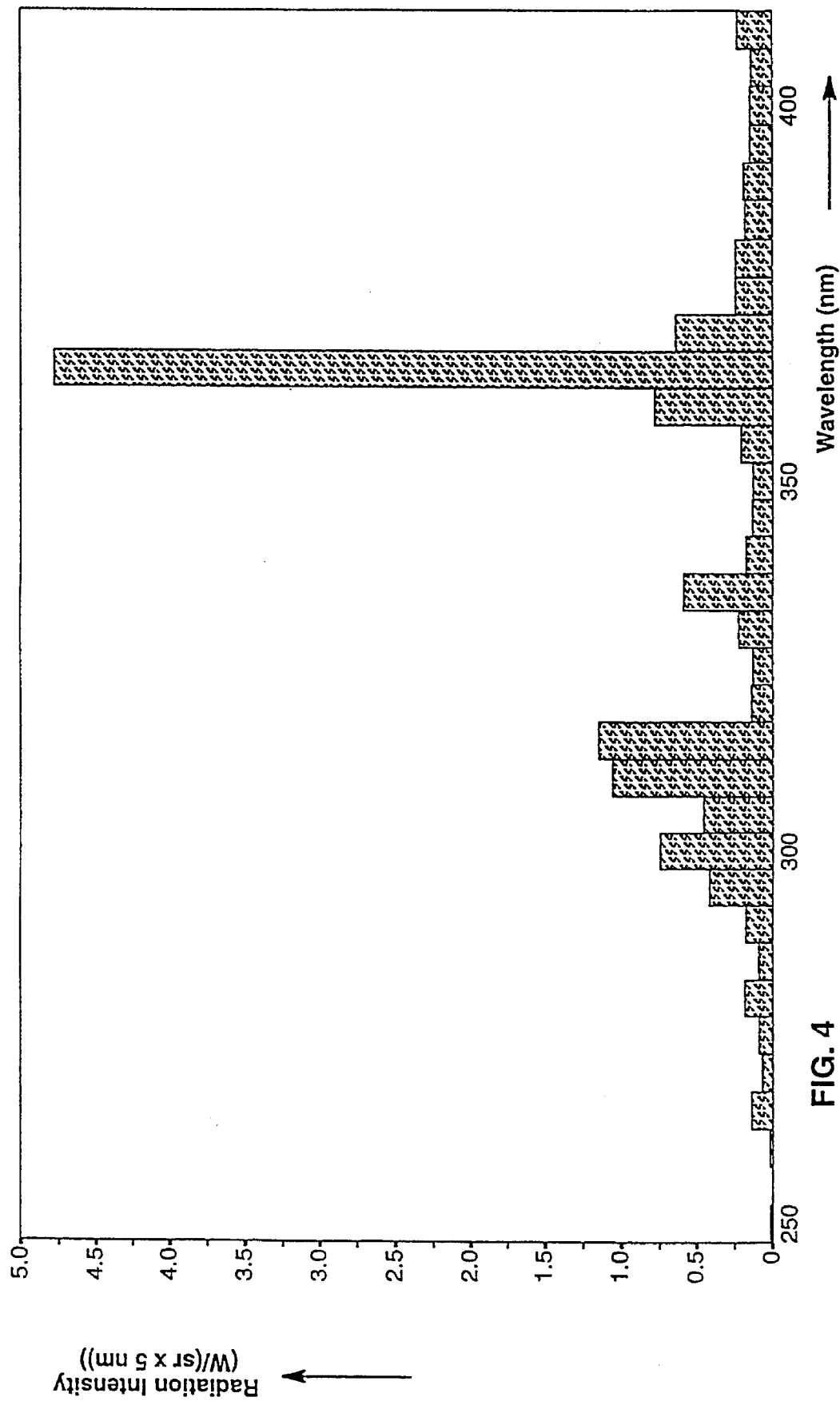
Figure 5:
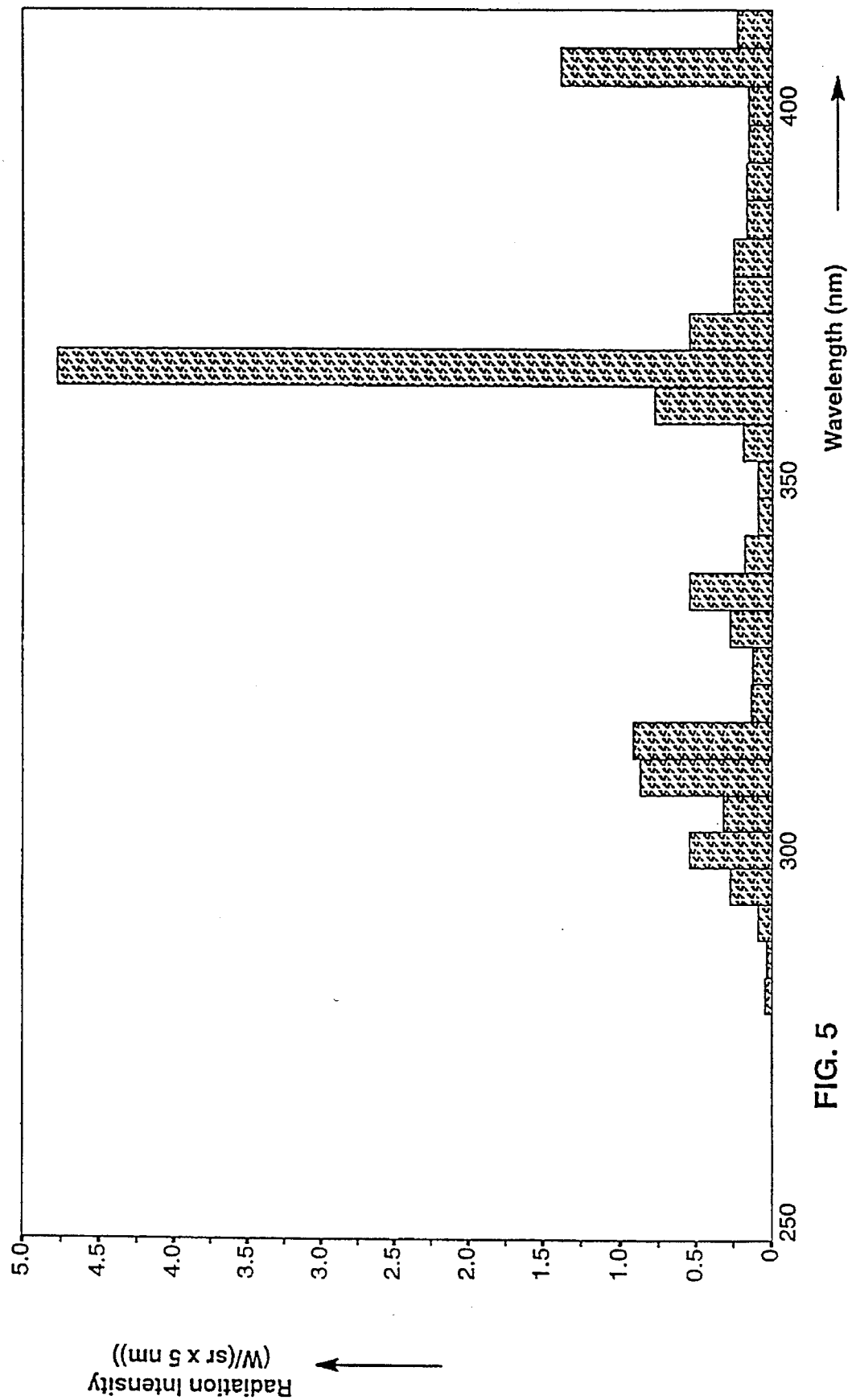
Figure 6:
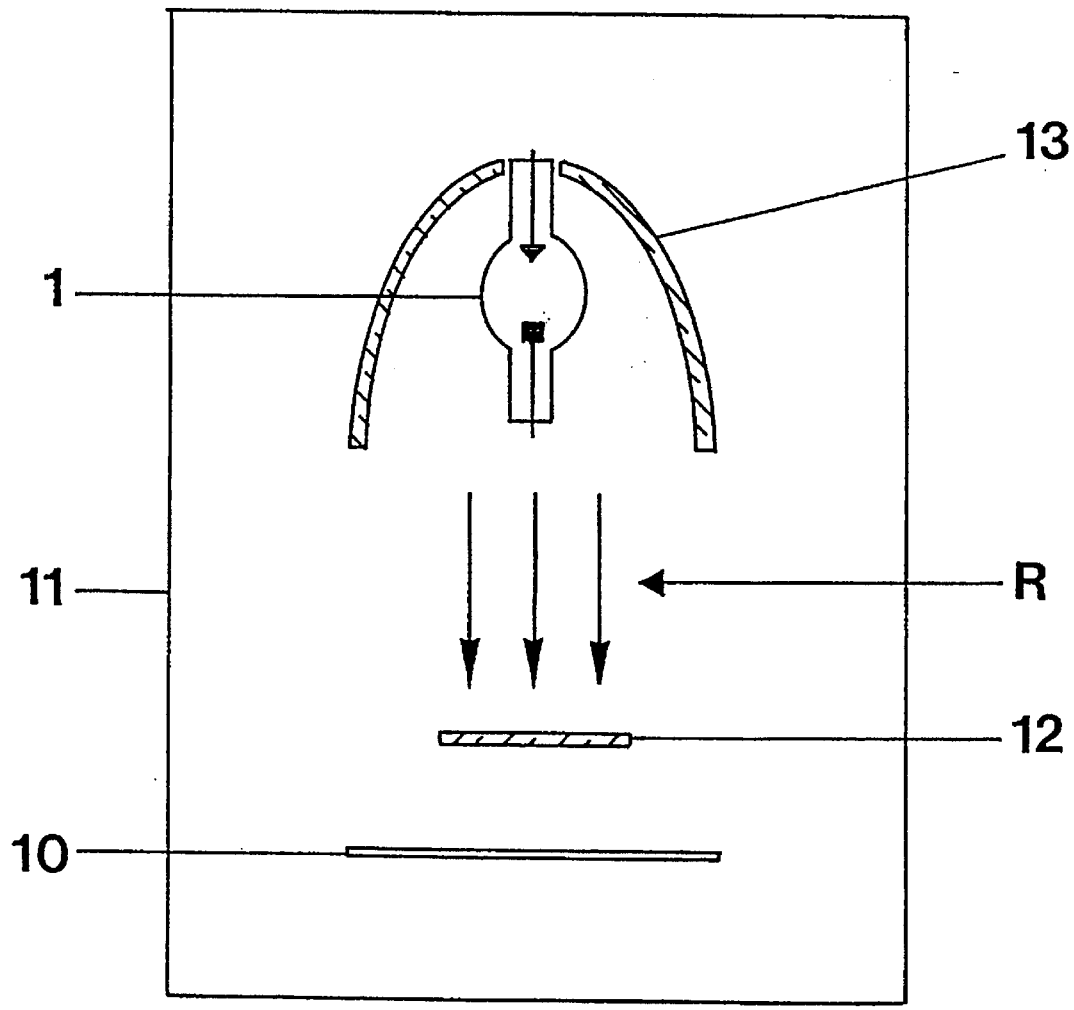

FIG. 4 illustrates the radiation intensity (ordinate) with respect to wavelengths between 250 and 400 nm of a short-arc mercury-vapor high-pressure discharge lamp with a multi-layer interference reflection filter at the outside of the discharge vessel and a titanium dioxide coating at the inside of the discharge vessel to absorb radiation below 240 nm;

FIG. 5 illustrates radiation intensity (ordinate) in the wavelength region between 250 and 400 nm of a mercury-vapor short-arc lamp having a multi-layer interference reflection filter at the outside of the discharge vessel and a titanium dioxide/silicon dioxide mixed layer on the reflection filter absorbing short wavelength UV radiation below 280 nm and a titanium dioxide coating on the inside of the discharge vessel absorbing UV radiation below 240 nm; and FIG. 6 is a highly schematic view of an exposure system for exposing a semiconductor wafer and also illustrating the method in accordance with the present invention.

DETAILED DESCRIPTION

Figure 1:
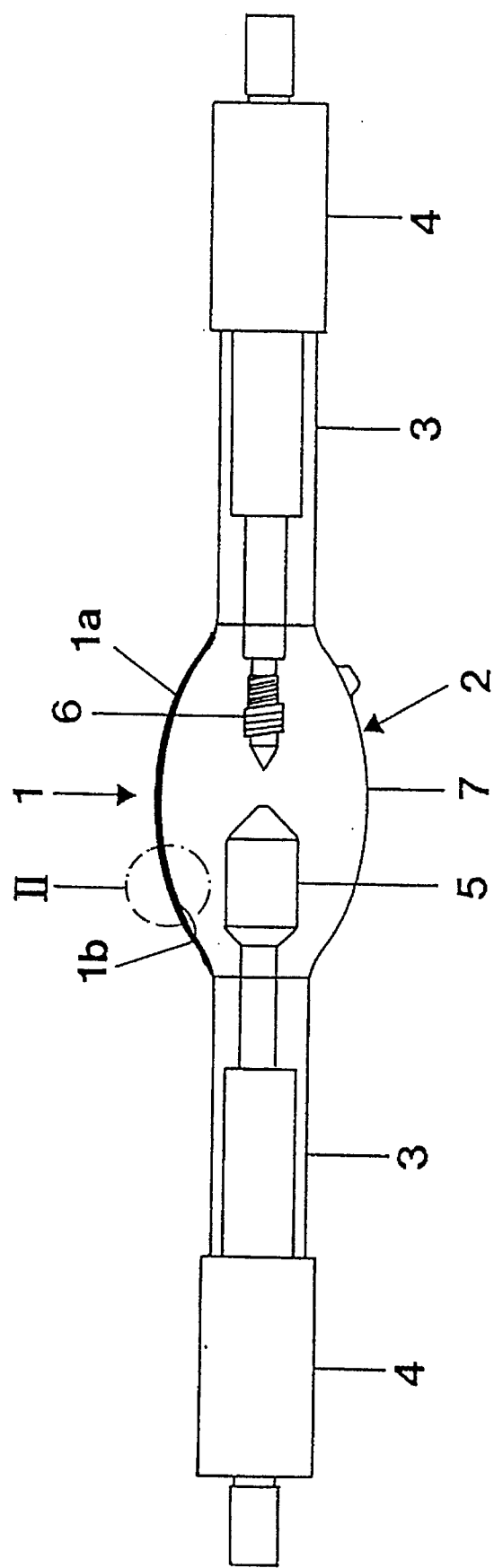
FIG. 1 is a highly schematic side view of a short-arc mercury-vapor high-pressure discharge lamp.

FIG. 1 is a side view of a schematically illustrated mercury-vapor short-arc lamp 1. As an example for purposes of illustration, the lamp 1 is a d-c lamp having a nominal rating of 1 kW. The lamp has a discharge vessel 2 of quartz glass, with two lamp shafts 3. An anode 5 and a cathode 6, with an anode-cathode spacing of about 3 mm, are located coaxially in the lamp. Bases 4 are secured to the lamp shafts 3. The bases carry electrical connections for conduction of electricity to the electrodes.

The discharge vessel 2 is made of undoped quartz glass. At the level of the arc gap, it has a diameter of about 30 mm, with a wall thickness of about 2.8 mm. The discharge vessel has a fill of mercury of about 8 mg/cm$^3$ and a xenon fill at a cold pressure of about 1.7 bar.

In accordance with the present invention, the outside of the discharge vessel has a coating 1a placed thereon formed by a multi-layer interference reflection filter. The inside of the lamp has a coating 1b of titanium dioxide. For better visibility, the coatings 1a, 1b are shown in FIG. 1 only on the upper-half of the lamp vessel 2, and highly exaggerated in their thickness.

The coatings, of course, adhere to the surfaces of the quartz glass of the lamp vessel.

A 3300 W nominally rated lamp has the same shape as the lamp 1 of FIG. 1, and a discharge vessel 2 made of undoped quartz glass. At the level of the arc gap, the diameter of such a lamp is about 70 mm, with a quartz glass wall thickness between about 3.5 and 4 mm. The mercury fill is about 3 mg/cm$^3$ and, further, the discharge vessel includes xenon at a cold fill pressure of about 0.8 bar. The outside coating 1a again is a multi-layer interference reflection filter; the inside coating 1b is titanium dioxide.

Figure 1A:
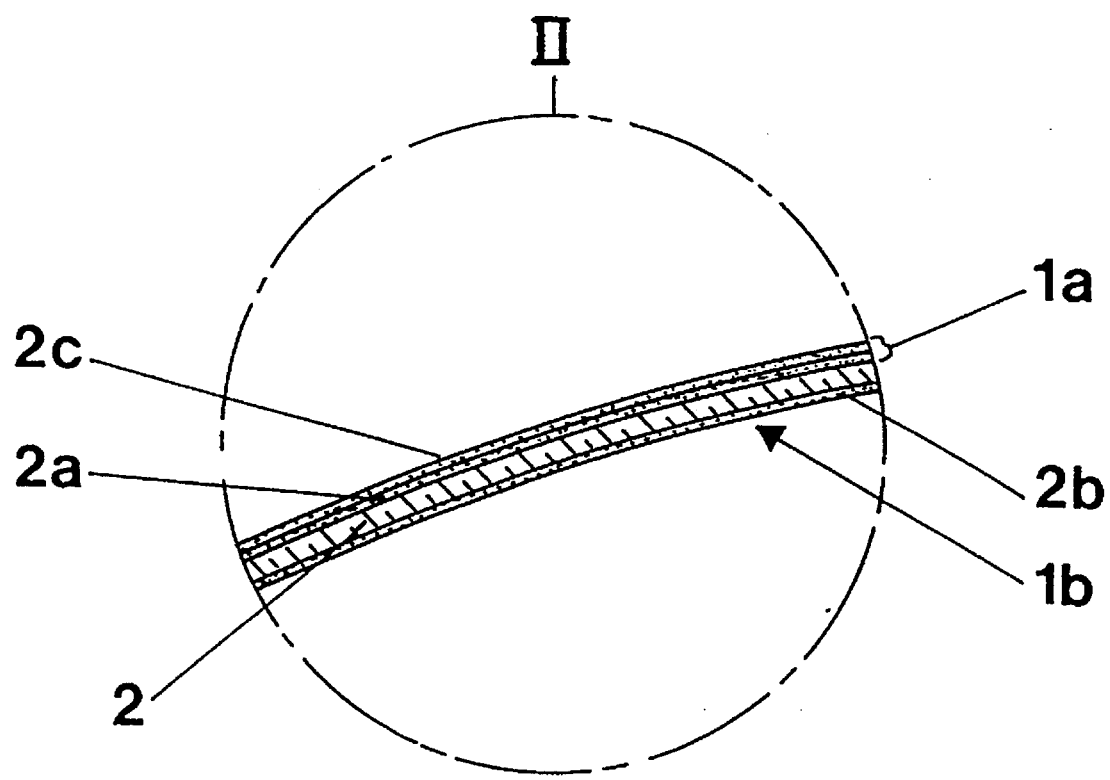
FIG. 1A is a view illustrating the layers on the vessel 2.

FIG. 1A shows the outer layer 1a and the inner layer 1b in greater detail. The wall of the vessel 2 is schematically shown by a hatched area on which a multi-layer interference reflection filter 2a is applied. Preferably, an inner layer 1b, formed by an absorbing titanium dioxide layer 2b, is applied. Most preferably, an additional absorbing layer 2c is applied over the selectively reflecting coating 2a formed, for example, of a titanium dioxide/silicon dioxide mixed layer. The layer 2a, preferably, is built up of at least 8 single layers, alternating between $ZrO_2$ and $S:O_2$. Any one of the individual layers preferably has a thickness of between about 30 and 50 nm.

Figure 2:
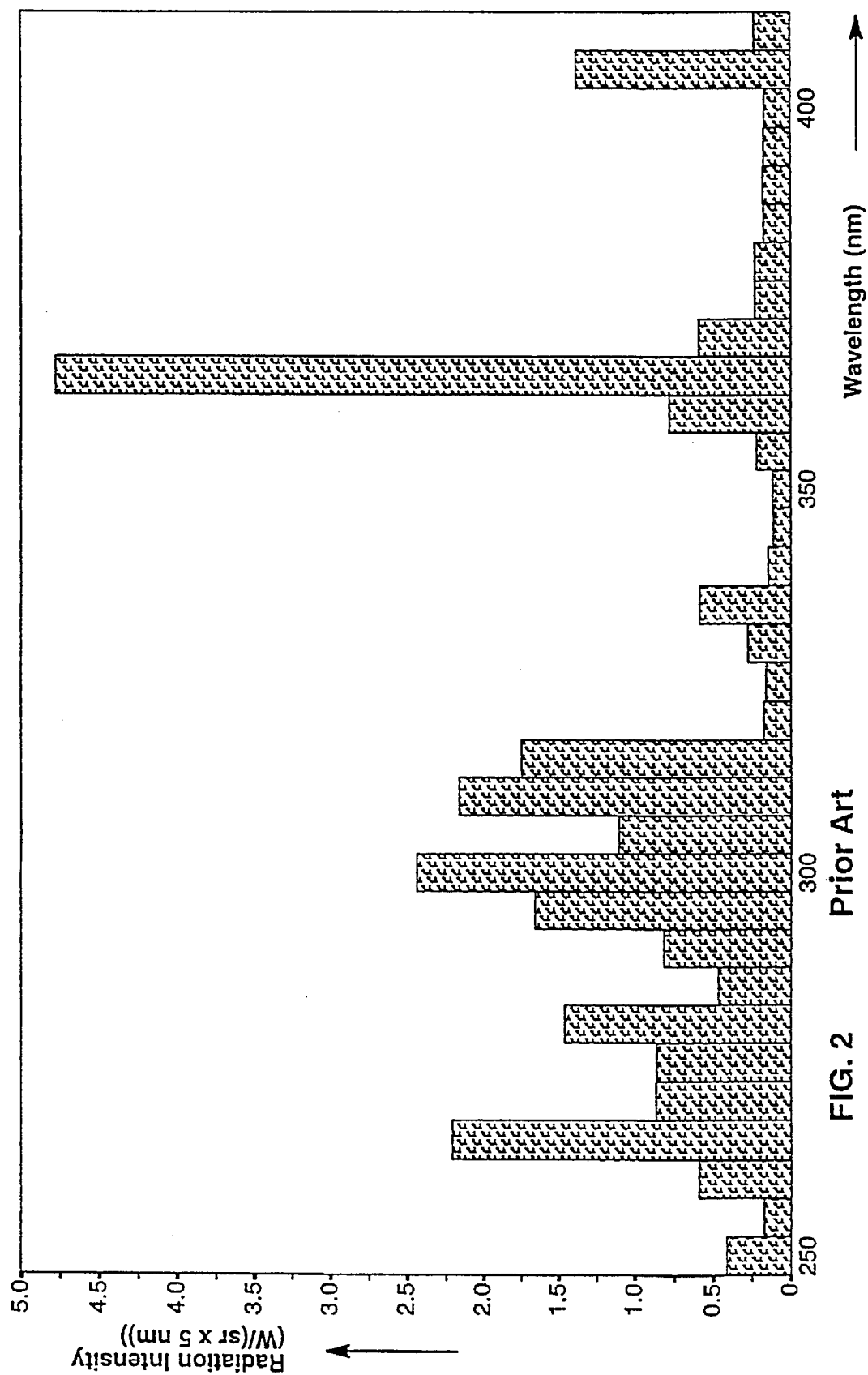
FIG. 2 is a graph illustrating radiation levels (ordinate) with respect to wavelength in nanometers between 250 and 400 nm of a lamp without any means to influence the radiation emitted from the discharge vessel.

The radiation intensity of a lamp constructed as shown in FIG. 1, without the coatings 1a, 1b, and merely having undoped quartz glass as the lamp vessel, nor any means to influence the radiation emitted by the mercury-vapor arc, is illustrated in FIG. 2 in the wavelength region between 250 and 400 nm. As can be clearly seen, besides the radiation of the desired wavelength of 365 nm, additional radiation in other wavelengths is provided. This additional radiation is a multiple of short-wave line and continuous radiation.

Figure 3:
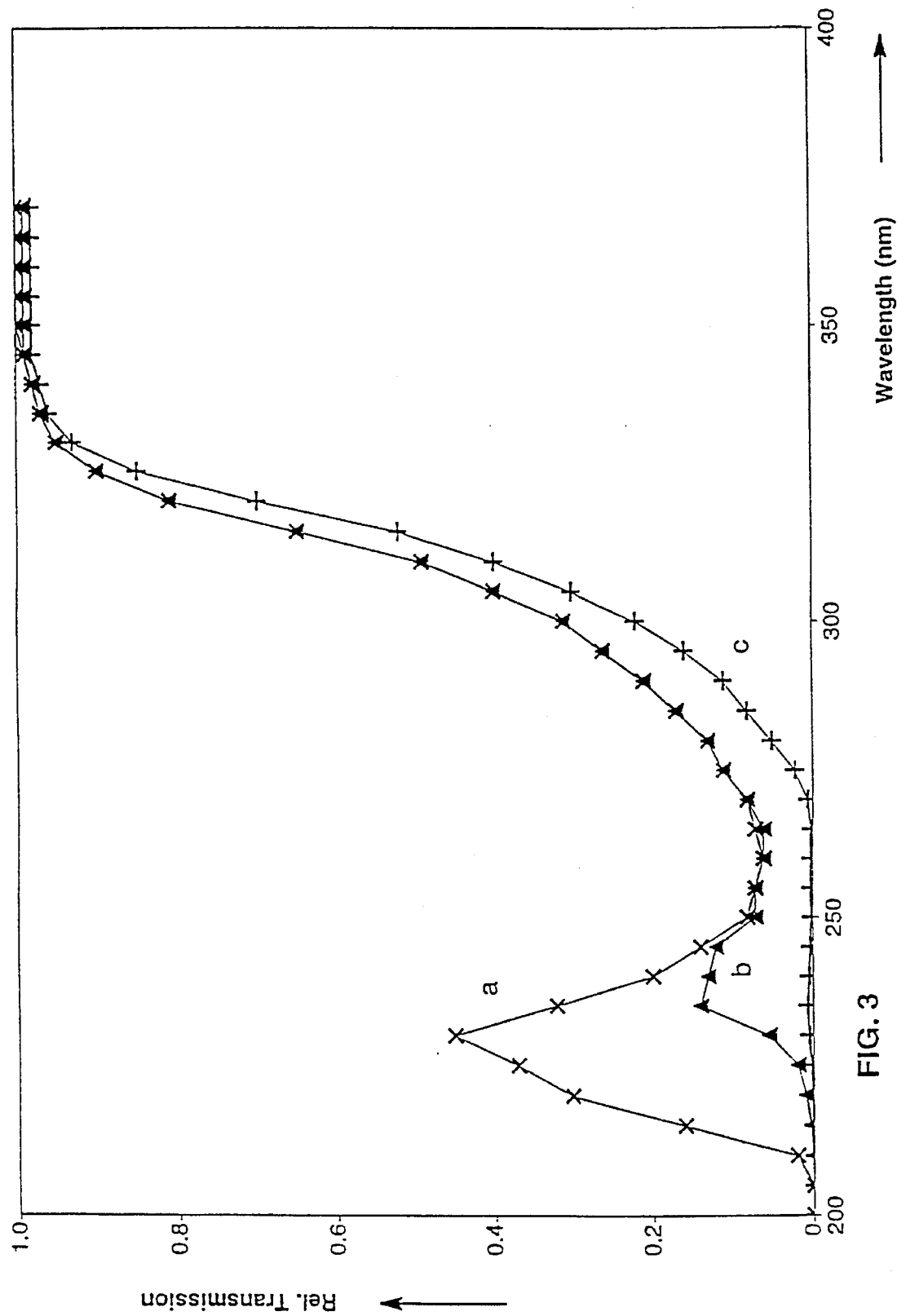
FIG. 3 illustrates, in three graphs, a, b, c, the effect of spectral filters with respect to wavelengths (abscissa)

FIG. 3 shows three curves in which curve a illustrates the spectral filter effect of a reflecting multi-layer interference reflection filter applied as the outside coating 1a, formed of 10 layers of, alternately, ZrO$_2$ and SiO$_2$.

Filter curve a of FIG. 3 represents the quotient of the spectral radiation intensities measured on a 1000 W lamp having a multi-layer interference reflection filter coating on the outside of the discharge vessel and on a 1000 W lamp with a discharge vessel without any filtering means, respectively. As can be seen, radiation between about 240 nm and 300 nm is effectively reflected by the multi-layer interference reflection filter. The ordinate is drawn in relative transmission, with transmission at 365 nm being 1.0 as this radiation passes the filter without attenuation. Radiation of shorter wavelength is increasingly reflected as the wavelength decreases. The 50% value of transmission is at 310 nm. Below about 250 nm, the transmission increases due to decreasing reflection by the multi-layer interference reflection filter.

Curve b of FIG. 3 illustrates the spectral filter effect of a multi-layer interference reflection filter according to curve a of FIG. 3 in combination with the spectral filter effect of a titanium dioxide coating 1b at the inside of the vessel 2. This results in reduction of the transmission below about 250 nm by absorption.

Curve c of FIG. 3 shows the spectral filter effect of the multi-layer interference reflection filter according to cure a of FIG. 3 in combination with the spectral filter effect of a titanium dioxide coating effective to absorb radiation below 240 nm wavelength (50% transmission) formed at the inside 1b of the discharge vessel (curve b) and further the filter effect of an absorbing titanium dioxide/silicon dioxide mixed layer applied as a last, highly refractive layer on the multi-layer interference filter. Use of such a three-layer filter—reflector—filter combination highly desirably provides for a steep drop-off of transmission in the wavelength region between 330 nm and 280 nm without, however, damping the radiation in the desired spectral band of 365 nm.

FIG. 4 illustrates the spectral distribution with respect to radiation intensity of a mercury-vapor short-arc lamp of 1500 W rated power in the wavelength region between 250 and 400 nm, derived by a combination of the filter effect of a multi-layer interference reflection filter reflecting radiation between 240 and 300 nm and a titanium dioxide coating 1b inside of the lamp absorbing radiation below 250 nm.

Comparing FIG. 2, which shows the spectral intensity of radiation of a mercury-vapor short-arc lamp made of undoped quartz glass with FIG. 4, a lamp likewise made of undoped quartz glass but having means to influence the radiation emitted from the lamp (FIG. 4), clearly illustrates reduction of radiation below the desired wavelength band of 365 nm, and particularly in UV wavelength regions below 330 nm.

FIG. 5 illustrates the spectral distribution of the radiation intensity of a mercury-vapor short-arc lamp of 1500 W rated power in the wavelength region between 250 and 400 nm. This lamp has a combination of spectral filter effect formed by a reflecting multi-layer interference reflection filter 2a reflecting radiation between 240 and 300 nm at the outside of the discharge vessel, together with an absorbing titanium dioxide/silicon dioxide mixed layer 2c applied over the reflecting multi-layer interference reflection filter in combination with a titanium dioxide coating 2b at the inside of the vessel absorbing radiation below 240 nm. The term "absorbing radiation" refers to absorption of at least 50% of radiation or, in other words, transmission of radiation under 50%.

Comparing FIG. 5 with FIG. 4, it is clearly seen that adding a titanium dioxide/silicon dixoide mixed layer 2c to the layer 2a at the outside of the lamp forming a multi-layer interference reflection-absorption filter 1a enhances the effect of the titanium dioxide layer at the inside of the vessel by further attenuating undesired UV radiation without, however, markedly attenuating the radiation in the desired wavelength band of 365 nm.

The lamp, in accordance with the present invention, permits economical use of exposure apparatus, particularly to make integrated circuits, since the costs and efforts required to remove undesired UV radiation, as well as cooling and ventilating, can be substantially reduced. Further, downtime of the apparatus for servicing, cleaning and repair of the optical components can be substantially reduced below that for apparatus using prior art lamps.

It is possible to use quartz glass which is selectively doped, for example, with titanium dioxide and possibly with titanium dioxide and/or tin oxide. Such quartz glass, preferably, has at the inside a layer 1b of selectively absorbing titanium dioxide and at the outside a selectively reflective coating 1a formed by a multi-layer interference reflection filter 2a.

The lamps in accordance with the present invention permit substantial reduction in external cooling required, and hence in the cost of the overall system. The overall system is schematically shown in FIG. 6, in which a semiconductor wafer 10 is positioned to be irradiated by the lamp 1. The lamp 1 is arranged in a reflector 13. The lamp 1 and the reflector 13 are located in a housing structure 11. The radiation, schematically shown by the arrows R, is optically projected by the system 12. The wafer 10, as is usual in such processes, is coated with an ultraviolet sensitive photo resist film to which mask features have been transferred. U.S. Pat. No. 4,732,842, Kira, is here referred to.

External blocking filters for the UV region can be substantially simplified or omitted entirely, so that the lamps in accordance with the present invention permit substantial reduction in the cost of the overall system.

Damage to the projection system 12 and to the housing structure 11, due to short wavelength UV radiation, is essentially eliminated or largely minimized. The overall system efficiency, its handling capacity, and its lifetime are thereby increased. The lamps used in the system have entirely unexpected positive side effects. The increased absorption and back-reflection of short UV radiation within the lamp have a tendency to heat the lamp sufficiently so that the lamp volume can be increased without danger of encountering mercury condensation. Increased lamp volume decreases the tendency to blackening of the bulb or envelope of the discharge vessel.

Various changes and modifications may be made, and any features described herein may be used with any of the others, within the scope of the inventive concept.

We claim:

1. Mercury high-pressure short-arc discharge lamp (1) having a discharge vessel (2) of quartz glass;

two electrodes (5, 6) spaced from each other, located within the discharge vessel;

a fill including xenon and mercury within the discharge vessel, said electrodes and fill of the discharge vessel being arranged so that, in operation of the lamp, the mercury of the fill will vaporize and provide spectral lines of radiation, including a spectral line having a wavelength of about 365 nm, and further radiation lines below 365 nm, wherein, in accordance with the invention, the quartz glass of the discharge vessel comprises means for preventing and essentially inhibiting emission of radiation from the lamp at spectral lines having wavelengths shorter than 365 nm, while permitting passage of radiation of the spectral line of 365 nm and of longer wavelengths, without essentially attenuating said permitted radiation, said radiation prevention and inhibiting means being devoid of vanadium or doping of the quartz glass by vanadium.

2. The lamp of claim 1, wherein said radiation prevention and inhibiting means comprises a coating (1a) at the outside of the discharge vessel which is selectively radiation reflecting, and an inner coating (1b) at the inside of the discharge vessel which is selectively radiation absorbing.

3. The lamp of claim 2, wherein the selectively reflective coating (1a) at the outside of the discharge vessel (2) comprises a multi-layer interference reflection filter (2a).

4. The lamp of claim 2, wherein the inner coating (1b) at the inside of the discharge vessel (2) comprises a selectively absorbing coating (2b) of titanium dioxide.

5. The lamp of claim 2, wherein the selectively reflective coating (1a) at the outside of the discharge vessel (2) comprises a multi-layer interference reflection filter; and wherein the inner coating (1b) at the inside of the discharge vessel (2) comprises a selectively absorbing coating (2b) of titanium dioxide.

6. The lamp of claim 5, wherein the multi-layer interference reflection filter (2a) at the outside of the discharge vessel is preferentially reflective selectively in wavelength regions between 240 to 300 nm, and has a filter cut-off, defined as 50% transmission, in the wavelength range between about 290 and 300 nm; and the innercoating (1b) comprising a titanium dioxide coating (2b) which is preferentially absorbing, selectively, in the wavelength region below 250 nm and has a filter cut-off, defined as 50% transmission, at about 240 nm.

7. The lamp of claim 1, wherein said radiation prevention and inhibition means comprises a coating (1a) at the outside of the discharge vessel which includes a selectively reflective coating (2a) and a selectively absorbing coating (2c); and wherein said radiation prevention and inhibition means further comprises an inner coating (1b) which is a selectively radiation absorbing coating (2b).

8. The lamp of claim 7, wherein the selectively absorbing inner coating (2b) of the discharge vessel comprises a titanium dioxide coating;

the selectively reflective coating (2a) at the outside of the discharge vessel comprises a multi-layer interference reflection filter; and the selectively absorbing coating (2c) at the outside of the discharge vessel comprises a titanium dioxide/silicon dioxide mixed layer applied over said multi-layer interference reflection filter coating.

9. The lamp of claim 8, wherein the titanium dioxide coating (2b) at the inside of the discharge vessel (2) is preferentially absorbing radiation below about 240 nm, and has an absorption cut-off, defined as 50% transmission, below about 240 nm;

the multi-layer interference reflection filter (2a) at the outside of the discharge vessel (2) is preferentially selective in the wavelength region between about 240 to 300 nm and has a filter cut-off, defined as 50% transmission, in the wavelength range of between about 290 and 330 nm; and the selectively absorbing titanium dioxide/silicon dioxide mixed layer (2c) applied over said interference filter (2a) is preferentially absorbing for radiation below about 280 nm wavelength, defined as 50% transmission of radiation.

10. The lamp of claim 1, wherein said discharge vessel (2) comprises quartz glass which is selectively absorbing ultraviolet radiation, and comprises a selectively reflective coating (1a, 2a) at the outside of the discharge vessel (2).

11. The lamp of claim 10, wherein said quartz glass of the discharge vessel (2) is doped with titanium dioxide.

12. The lamp of claim 1, wherein said discharge vessel (2) comprises a quartz glass which is selectively absorbing ultraviolet radiation and comprises a selectively reflective coating (1a, 2a) at the outside of the discharge vessel (2); and further including a selectively absorbing coating (2c) applied at the outside of the discharge vessel (2).

13. The lamp of claim 1, wherein the discharge vessel comprises quartz glass doped with titanium oxide and, optionally, tin oxide;

a selectively absorbing coating (2b) comprising titanium dioxide being applied to the inside of said discharge vessel (2); and a selectively reflective coating comprising a multi-layer interference reflection filter (2a) being applied to the outside of said discharge vessel.

14. The lamp of claim 6, wherein the multi-layer interference reflection filter (2a) at the outside of the discharge vessel (2) comprises at least 8 individual layers of alternately applied $ZrO_2$ and $SiO_2$.

15. The lamp of claim 14, wherein the individual layers each have a thickness of between about 30 nm and 50 nm.

16. The lamp of claim 9, wherein the multi-layer interference reflection filter (2a) at the outside of the discharge vessel (2) comprises at least 8 individual layers of alternately applied $ZrO_2$ and $SiO_2$.

17. The lamp of claim 16, wherein the individual layers each have a thickness of between about 30 nm and 50 nm.

18. The lamp of claim 1, wherein the electrodes (5, 6) are spaced from each other within the discharge vessel (2) by an electrode spacing of between about 2 and 9 nm.

19. A semiconductor exposure system, comprising a housing (11);

a semiconductor wafer (10) located within the housing;

a mercury high-pressure short-arc discharge lamp; having a discharge vessel (2) of quartz glass;

two electrodes (5, 6) spaced from each other, located within the discharge vessel;

a fill including xenon and mercury within the discharge vessel, said electrodes and fill of the discharge vessel being arranged so that, in operation of the lamp, the mercury of the fill will vaporize and provide spectral lines of radiation, including a spectral line having a wavelength of about 365 nm, and further radiation lines below 365 nm, wherein, in accordance with the invention, the quartz glass of the discharge vessel comprises means for preventing and essentially inhibiting emission of radiation from the lamp at lines having wavelengths shorter than 365 nm, while permitting passage of radiation of the spectral line of 365 nm and of longer wavelengths, without essentially attenuating said permitted radiation, said radiation prevention and inhibiting means being devoid of vanadium or doping of the quartz glass by vanadium;

said discharge lamp being located within the housing, and positioned to project (12) radiation (R) onto said semiconductor wafer (10), said radiation having wavelengths of about 365 nm and higher only.

20. A method of exposing a semiconductor wafer (10), comprising the steps of:

providing a high-pressure mercury discharge lamp (1) having a discharge vessel (2) of quartz glass, said quartz glass being devoid of vanadium or doping by vanadium;

two electrodes (5, 6) spaced from each other, located within the discharge vessel;

a fill including xenon and mercury within the discharge vessel, said electrodes and fill of the discharge vessel being arranged therein so that, in operation of the lamp, the mercury of the fill will provide spectral lines of radiation including a line having a wavelength of about 365 nm, and further radiation lines below 365 nm;

said method further comprising the steps of reflecting back into the lamp radiation of wavelength below 365 nm; and further absorbing radiation at the inside of the discharge vessel, optionally preferentially selective in the wavelength region below about 250 nm, and having an absorption edge, defined as 50% transmission, at about 240 nm.

21. The method of claim 20, further including the step of absorbing residual radiation passed during the reflection step by selectively absorbing at least a portion of said residual radiation with a preferentially selective absorption edge or cut-off, defined as 50% transmission, which is below about 280 nm wavelength of the radiation emitted, in operation, by the lamp.

22. The method of claim 20, wherein the step of reflecting back into the lamp radiation of wavelengths below 365 nm comprises reflecting back radiation in the range of wavelengths between about 240 and 300 nm with a cut-off edge, defined as 50% transmission, in the wavelength region between about 290 and 330 nm.

* * * * *